(12) United States Patent
Nagaoka

(10) Patent No.: US 6,781,917 B2
(45) Date of Patent: Aug. 24, 2004

(54) SEMICONDUCTOR MEMORY DEVICE WITH DUAL PORT MEMORY CELLS

(75) Inventor: Hideaki Nagaoka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/178,411

(22) Filed: Jun. 25, 2002

(65) Prior Publication Data

US 2003/0026124 A1 Feb. 6, 2003

(30) Foreign Application Priority Data

Aug. 2, 2001 (JP) .......................................... 2001-235166

(51) Int. Cl.[7] ................................................ G11C 8/00
(52) U.S. Cl. .................................. 365/230.05; 365/154
(58) Field of Search .......................... 365/230.05, 154, 365/156

(56) References Cited

U.S. PATENT DOCUMENTS 5,646,885 A * 7/1997 Matsuo et al. .......... 365/185.05
6,285,578 B1 * 9/2001 Huang ........................ 365/154
6,363,005 B1 * 3/2002 Wang et al. ................. 365/154

FOREIGN PATENT DOCUMENTS

JP          05-166375       7/1993

* cited by examiner

Primary Examiner—Hoai Ho
(74) Attorney, Agent, or Firm—Burns, Doane, Swecker & Mathis, L.L.P.

(57) ABSTRACT

A semiconductor memory device is provided including plural memory cells and capable of a dual port access. In the memory device the memory cell is composed with two driver transistors 1, two load transistors 2, and two access transistors 3, and in the data read, the word line 11 makes the access transistors 3 conductive to read out data held in the driver transistors to a pair of the bit lines, and in the data write, the load transistor control line makes the load transistors conductive to write data into the driver transistors from a pair of the memory cell VCC lines.

5 Claims, 12 Drawing Sheets

SEMICONDUCTOR MEMORY DEVICE WITH DUAL PORT MEMORY CELLS

BACKGROUND OF THE INVENTION

1. Field of the Invention

The present invention relates to a semiconductor memory device composed of dual port memory cells containing two ports for one memory cell.

2. Description of Related Art

First, an explanation on a single port memory cell will be given.

FIG. 11 is a block diagram to illustrate a conventional two-word configuration SRAM provided with two data input/output terminals. In the drawing, reference marks X0 to X8 designate a row address signal input terminal, Y0 to Y8 denote a column address signal input terminal, Z0 denotes a block address signal input terminal, reference numerals 101, 102 denote memory blocks, 103 denotes an address buffer that inputs a row address signal, 104 denotes an address buffer that inputs a column address signal, 105 denotes an address buffer that inputs a block address signal, 106 denotes a row decoder that selects a word line to be accessed in the memory blocks 101, 102, 107 denotes a column decoder that selects a bit line pair to be accessed in the memory blocks 101, 102, and 108 denotes a block selector that selects the memory blocks 101, 102 to be accessed.

Further, in FIG. 11, reference numeral 109 denotes a sensing amplifier that amplifies potential variations of the bit line pairs that were selected during data read, 110 denotes a writing driver that inputs write data, 111 denotes a data bus, 112 denotes an output buffer that outputs a read data, 113 denotes an input buffer including an input protection circuit, that inputs a write data and converts the data into an internal logic level, and DQ1, DQ2 a data input/output terminal.

FIG. 12 is a circuit diagram to illustrate the internal configuration of the memory blocks 101, 102, and in the drawing, a reference numeral 121 denotes a memory cell arrayed in the row and column directions, 122 denotes a bit line load transistor being a load to the bit line, 123 denotes a multiplexer that selects a bit line pair on the basis of the output of the column decoder 107, 125 denotes a word line to be selected on the basis of the output of the row decoder 106, 126 denotes a bit line to be selected on the basis of the output of the column decoder 107 through the multiplexer 123, 127 denotes a pre-charge transistor that beforehand charges the bit line 126 to a level of potential VCC which is the level of a power supply when in a non-selected state, 128 denotes an equalizing transistor connected to two bit lines 126, that equalizes the levels of the two bit lines 126 when in the non-selected state, 129 denotes an IO line connected to the sensing amplifier 109 and the writing driver 110 shown in FIG. 11.

FIG. 13 is a circuit diagram to illustrate the internal configuration of the Full CMOS type single port memory cell 121, and in the drawing, reference 131 denotes denote a driver transistor that holds data, 132 denotes a load transistor that functions as the load to the driver transistor 131, and 133 denotes an access transistor, being turned ON (to be low resistance) by selecting the word line 125, connects the bit line 126 and a memory node A or B.

Here, the memory nodes A, B to hold data are connecting points of a drain of the driver transistor 131, a drain of the load transistor 132, and a source of the access transistor 133. But, with regard to a drain and the source of access transistor 133, it is determined in accordance with a state of the voltage applied. Thus, being composed with a two pairs of inverters composed by the driver transistors 131 and the load transistors 132, the memory cell holds data by a latch in which an input of one side is mutually connected to an output of the other side.

FIG. 14 is a circuit diagram to illustrate the internal configuration of a high resistance type single port memory cell 121, and in the drawing, reference numeral 134 denotes a resistor with high resistance that functions as a load to the driver transistor 131. In FIG. 14, the high resistance resistors 134 are used in replacement for the load transistors 132 in the Full CMOS type single port memory cell 121 shown in FIG. 13. In FIG. 14, being composed with the two pairs of inverters composed by the driver transistors 131 and the high resistance resistors 134, the memory cell holds data by a latch in which an input of one side is mutually connected to an output of the other side.

Next, the operation will be explained.

First, the reading operation will be explained. Complementary data are held at the memory nodes A, B that are connected to the drains of the driver transistors 131 in the memory cell 121 illustrated in FIG. 13 or FIG. 14. First, the bit lines 126 are charged in advance to a level of potential VCC which is the level of a power supply the pre-charge transistors 127.

The row decoder 106 decodes the row address signals, and activates the word line 125 to be accessed to the VCC level. In the memory cell 121 of the selected row, the access transistors 133 are turned ON to flow a column current through the bit lines 126. This causes the potential of the bit line 126 to become lower on the side of the memory node A or memory node B that holds the L level data. The column decoder 107 decodes the column address signals to input the decoded signal to the multiplexer 123 of the column to be accessed, and selects the bit line pair 126. The sensing amplifier 109 amplifies the potential variations of the bit line pair 126 that has been selected.

The block selector 108 inputs a block address signal that denotes the memory block 101 or 102 to be accessed, and decodes the input block address signal to generate a block selection signal. The sensing amplifier 109 inputs the block selection signal, and outputs only the data of the selected memory block 101 or 102 to the output buffer 112 through the data bus 111. The output buffer 112 is a tri-state output buffer, which outputs data to the data input/output terminals DQ1, DQ2 when an external OE signal (output enable signal) is in H level. When the OE signal is in L level, the buffer becomes high impedance, and it does not output data to the data input/output terminals DQ1, DQ2.

Next, the writing operation will be explained. The input buffer 113 converts the data input from the outside to the input/output terminals DQ1, DQ2 into an internal data level, and outputs the data to the data bus 111 when the external WE signal (write enable signal) is in H level. The block selection signal from the block selector 108 activates the writing driver 110 of the memory block 101 or 102 that has been selected. The activated writing driver 110 outputs the data on the data bus 111 to the IO line 129 of the selected memory block 101 or 102.

The column decoder 107 activates a pair of multiplexers 123, which input the data on the IO line 129 into the bit line pair 126. The row decoder 106 activates one word line 125 to the VCC level to turn ON the access transistors 133, which writes the data on the bit line pair 126 into one memory cell 121.

FIG. 15 is a circuit diagram to illustrate internal configuration of a conventional dual port memory cell. The conventional dual port memory cell is made to simultaneously access two memory cells of one and the same memory, and to simultaneously execute the read and writing operations to the one memory. The memory cell provides with two sets of row decoders 106, column decoders 107, block selectors 108, data buses 111, bit line load transistors 122, multiplexers 123, pre-charge transistors 127, and equalizing transistors 128 for both writing and read. And, as shown in FIG. 15, two access transistors 133, 135 are connected to each of the memory nodes A, B, and two sets of the word lines 125 and the bit lines 126 are wired for writing and read.

Since the semiconductor memory device using the conventional dual port memory cell is composed as described above, one memory cell requires eight transistors, which inevitably expands the layout area.

SUMMARY OF THE INVENTION

The present invention has been made in view of the foregoing circumstances, and it is an object of the present invention to provide a semiconductor memory device using dual port memory cells that permits reduction of the layout area.

In the semiconductor memory device according to the present invention; a memory cell is composed with two driver devices that hold data, two load devices that serve as loads to the driver devices, and two access devices that access the driver devices; a word line is connected to the access devices in the memory cells arrayed in the row direction; a pair of bit lines are connected to the access devices in the memory cells arrayed in the column direction; a load device control line is connected to said load devices in the memory cells arrayed in one of a direction of the row direction and the column direction, a pair of memory cell VCC lines are connected to said load devices in the memory cells arrayed in the other direction of the row direction and the column direction; in the data read, the word line makes the access devices conductive to read out data held in the driver devices to the a pair of bit lines; and in the data write, the load device control line brings the load devices into low resistance to write data into the driver devices from the a pair of memory cell VCC lines. By this arrangement the semiconductor memory device of the present invention has an effect to achieve availability of reducing the area of the memory cell array.

DETAILED DESCRIPTION OF THE PREFERRED EMBODIMENTS

Hereinafter the preferred embodiments of the present invention will be described.

Embodiment 1

Figure 1:
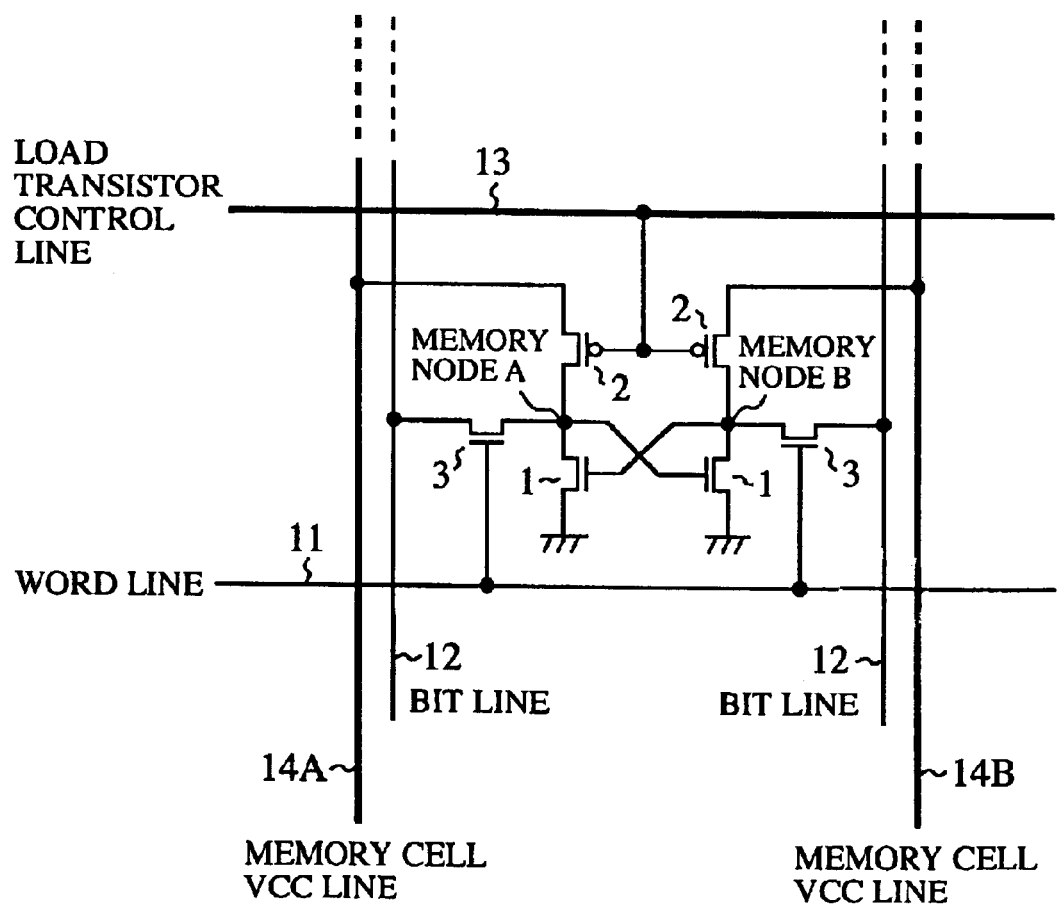
FIG. 1 is a circuit diagram to illustrate a construction of a dual port memory cell in the semiconductor memory device according to the embodiment 1 of the present invention.

FIG. 1 is a circuit diagram to illustrate a construction of a dual port memory cell in the semiconductor memory device according to the embodiment 1 of the present invention. In the drawing, reference numeral 1 denotes a driver transistor (NMOS transistor) that holds data, 2 denotes a load transistor (PMOS transistor) that functions as a load to the driver transistor 1, 3 denotes an access transistor (NMOS transistor) that is turned ON by selecting a word line, and connects a bit line with a memory node A or B.

Figure 13:
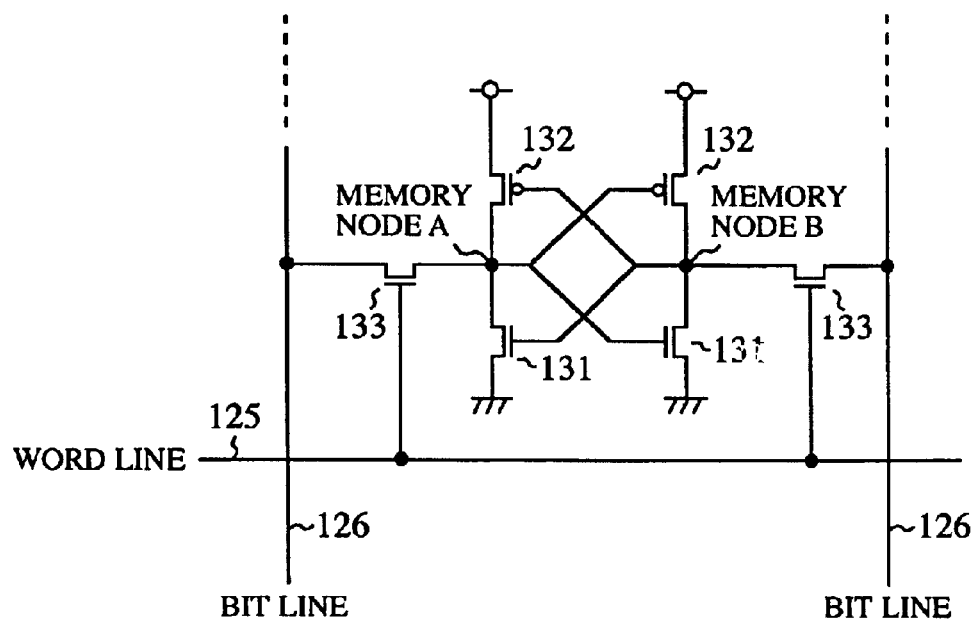
FIG. 13 is a circuit diagram to illustrate an internal construction of the conventional Full CMOS type single port memory cell.

Here, the memory nodes A, B are connecting points of a drain of the driver transistor 1, a drain of the load transistor 2, and a source of the access transistor 3, which is the same as FIG. 13. However, with regard to a drain and the source of access transistor 3, it is determined in accordance with the state of the voltage applied.

Further, in FIG. 1, reference numeral 11 denotes the word line that selects a memory cell in the row direction, 12 denotes the bit line that selects a memory cell in the column direction, 13 denotes a load transistor control line that controls the load transistor 2, 14A denotes a memory cell VCC line corresponding to the memory node A, and 14B denotes a memory cell VCC line corresponding to the memory node B. Herein, the load transistor control line 13 is provided from the outside with a potential of the power supply VCC level or the ground potential GND level. And, the memory cell VCC lines 14A and 14B are provided from the outside with a potential equal to the VCC level or higher than the VCC level, VCCwh level.

Figure 2:
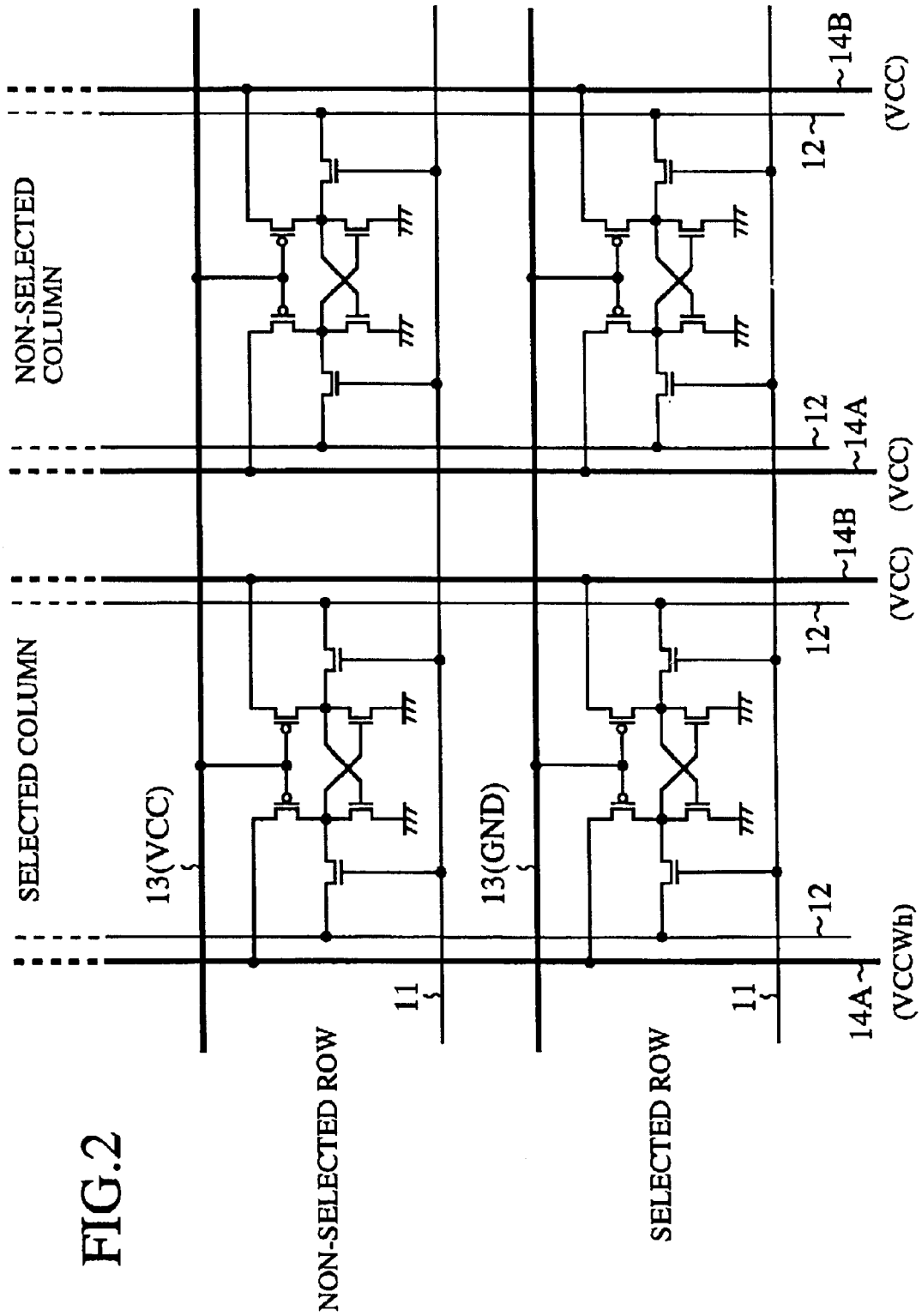
FIG. 2 is a circuit diagram to illustrate a construction of a memory cell array being the semiconductor memory device according to the embodiment 1 of the present invention.

FIG. 2 is a circuit diagram to illustrate a construction of a memory cell array being the semiconductor memory device according to the embodiment 1, in which the dual port memory cells shown in FIG. 1 are used. As shown in FIG. 1 and FIG. 2, the gates of the load transistors 2 are connected to the load transistor control line 13, in common to the memory cells arrayed in the row direction, and the sources of the load transistors 2 are connected to the memory cell VCC lines 14A and 14B, in common to the memory cells arrayed in the column direction. As to the memory cell VCC lines, the memory cell VCC line 14A is connected in correspondence with the memory node A in the memory cell, and the memory cell VCC line 14B is connected in correspondence with the memory node B.

Next, the operation will be explained.

Figure 14:
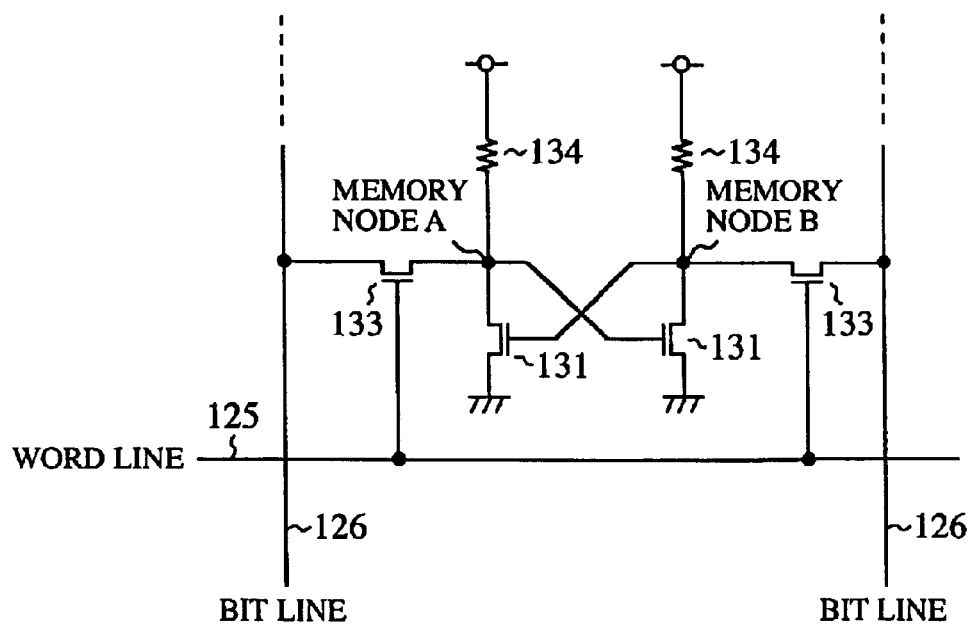
FIG. 14 is a circuit diagram to illustrate an internal construction of the conventional high-resistance type single port memory cell.

First, the data holding state will be explained. The load transistor control line 13 of the concerned memory cell is brought into the power potential VCC level, and the word line 11 is brought into the ground potential GND level. Also, both the memory cell VCC line 14A and memory cell VCC lines 14B are brought into the VCC level. Since the load transistor control line 13 is in the VCC level, the load transistors 2 flow only leak currents. Therefore, the memory cell is able to hold data in the same manner as the conventional high resistance type memory cell illustrated in FIG. 14.

Next, the reading operation will be explained. The load transistor control line 13 of the concerned memory cell is brought into the VCC level, and the word line 11 is brought into the VCC level. Also, both the memory cell VCC lines 14A and 14B are brought into the VCC level. Since the load transistor control line 13 is in the VCC level, the load transistors 2 flow only leak currents. Thus, the potential of the bit line 12 on the side of the memory node A or B that holds the L level data goes down to start the reading operation in the same manner as the conventional high resistance type memory cell illustrated in FIG. 14.

Next, the writing operation will be explained. As an example, the H level data written into the memory node A will be shown, but the H level data written into the memory node B is the same. The load transistor control line 13 of the concerned memory cell is brought into the GND level, and the word line 11 is brought into the GND level. In order to write the H level data into the memory node A, the memory cell VCC line 14A is brought into the VCCwh level higher than the VCC level, and the memory cell VCC line 14B is brought into the VCC level. Since the load transistor control line 13 is in the GND level, the resistances of the load transistors 2 go down, and the data holding state of the memory cell becomes unstable. Now, since the potential of the memory cell VCC line 14A on the side of the H level data being written is the VCCwh that is higher than the VCC being the potential of the memory cell VCC line 14B, the L level data at the memory node A cannot be held, and the H level data is written into the memory node A. When the memory node A becomes H level, the driver transistor 1 on the side of the memory node B is turned ON, the L level data is written into the memory node B.

Figure 3:
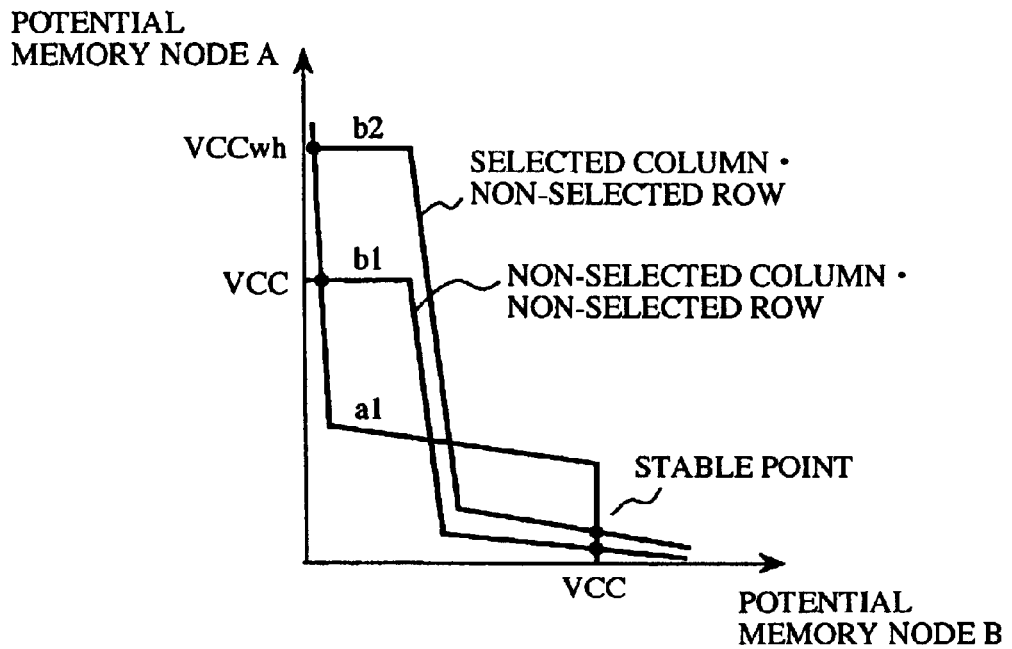
FIG. 3 is a graph to illustrate the data holding state of the memory cell at a non-selected row during the writing operation in the semiconductor memory device of the embodiment 1 of the present invention.

FIG. 3 is a graph to illustrate the data holding state of the memory cell at a non-selected row during the writing operation, and in the drawing the vertical axis represents the potential of the memory node A, the horizontal axis represents the potential of the memory node B, a1 represents the output to the memory node B of the inverter (composed of the driver transistor 1 and the load transistor 2 on the side of the memory node B) that takes the memory node A as the input, b1 represents the output to the memory node A of the inverter (composed of the driver transistor 1 and the load transistor 2 on the side of the memory node A) that takes the memory node B as the input in the non-selected column and non-selected row, and b2 represents the output to the memory node A of the inverter that takes the memory node B as the input in the selected column and non-selected row.

In the memory cell of the non-selected column and non-selected row, the potential of the memory node A being at the VCC level varies as the carve b1 as the potential of the memory node B increases, in the memory cell of the selected column and non-selected row, the potential of the memory node A being at the VCCwh level varies as the carve b2 as the potential of the memory node B increases, and in the memory cell of the non-selected row, the potential of the memory node B being at the VCC level varies as the carve a1 as the potential of the memory node A increases.

In FIG. 3, the black dotted intersection of a1 and b1 and the black dotted intersection of a1 and b2 become stable points. This means that the memory cell cannot be stable at any point except for the intersections of a1, b1, etc., because the input of the inverter on the side of the memory node A is the output of the inverter on the side of the memory node B, and the input of the inverter on the side of the memory node B is the output of the inverter on the side of the memory node A. Here, the carves b1 and b2 intersect the carve a1 near the center of FIG. 3, however the characteristics sharply varies in this area; and, even if the potentials of the memory nodes A, B come into this area, the potentials will shift to the stable points indicated by the black dots by disturbances such as noises.

Further, the drawing shows that the bigger the diameter of a circle inscribed to a graphic form enclosed by a1 and b1, and the diameter of a circle inscribed to a graphic form enclosed by a1 and b2 become, the more stable the data holding state becomes. In case that the diameter of a circle inscribed to a graphic form enclosed by a1 and b1 is small, VCC and GND vary by the influence of noises and the like, and as a1 and b1 vary according to the noises, the stable point becomes one. Thereby, the data holding becomes impossible.

Figure 4:
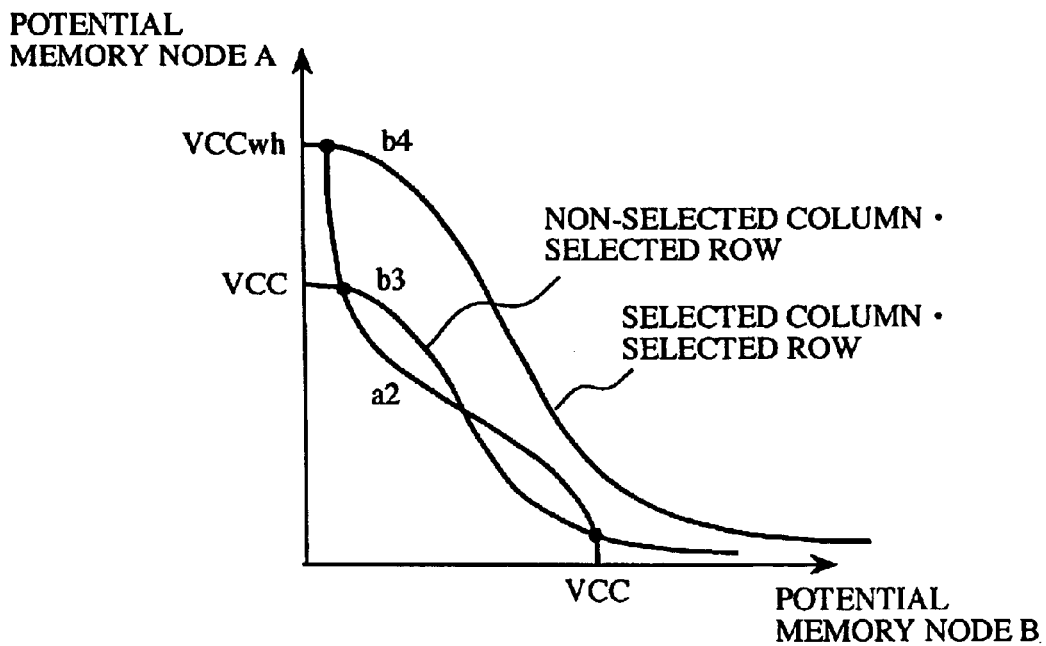
FIG. 4 is a graph to illustrate the data holding state of the memory cell at a selected row during the writing operation in the semiconductor memory device of the embodiment 1 of the present invention.

FIG. 4 is a graph to illustrate the data holding state of the memory cell at a selected row during the writing operation, and in the same manner as FIG. 3, the vertical axis represents the potential of the memory node A, the horizontal axis represents the potential of the memory node B, a2 represents the output to the memory node B of the inverter that takes the memory node A as the input, b3 represents the output to the memory node A of the inverter that takes the memory node B as the input in the non-selected column and selected row, and b4 represents the output to the memory node A of the inverter that takes the memory node B as the input in the selected column and selected row. In the memory cell of the selected row, the load transistors 2 are turned ON, and the resistances of the load transistors 2 becomes low; accordingly, a2, b3, b4 illustrated in FIG. 4 are those which the slopes of a1, b1, b2 illustrated in FIG. 3 are each diminished.

Also in FIG. 4, the black dotted intersection of a2 and b3 and the black dotted intersection of a2 and b4 represent stable points, and the drawing shows that the bigger the diameter of a circle inscribed to a graphic form enclosed by a2 and b3, and the diameter of a circle inscribed to a graphic form enclosed by a2 and b4 become, the more stable the data holding state becomes.

In FIG. 3, in the non-selected column and non-selected row, the load transistor control line 13 is in the VCC level, and the memory cell VCC line 14A and 14B are both in the VCC level; accordingly, the memory cell has two stable points as illustrated by a1 and b1, and attains the normal data holding state. And in the selected column and non-selected row, the load transistor control line 13 is in the VCC level, the memory cell VCC line 14A is in the VCCwh level, and the memory cell VCC line 14B is in the VCC level; accordingly, the memory cell has two stable points as illustrated by a1 and b2, and the data holding is possible. Further, in case of FIG. 3, the diameter of a circle inscribed to a graphic form enclosed by a1 and b1 and the diameter of a circle inscribed to a graphic form enclosed by a1 and b2 are significantly big, and the stability of data holing is enhanced.

In FIG. 4, in the non-selected column and selected row, the load transistor control line 13 is in the GND level, and the memory cell VCC line 14A and 14B are both in the VCC level; accordingly, the memory cell has two stable points as illustrated by a2 and b3, and the data holding is possible. On the other hand, in the selected column and selected row, the load transistor control line 13 is in the GND level, the memory cell VCC line 14A is in the VCCwh level, and the memory cell VCC line 14B is in the VCC level; accordingly, the memory cell has one stable point as illustrated by a2 and b4, which leads to impossibility of the L level data holding at the memory node A, and the H level data is written into the memory node A.

Figure 15:
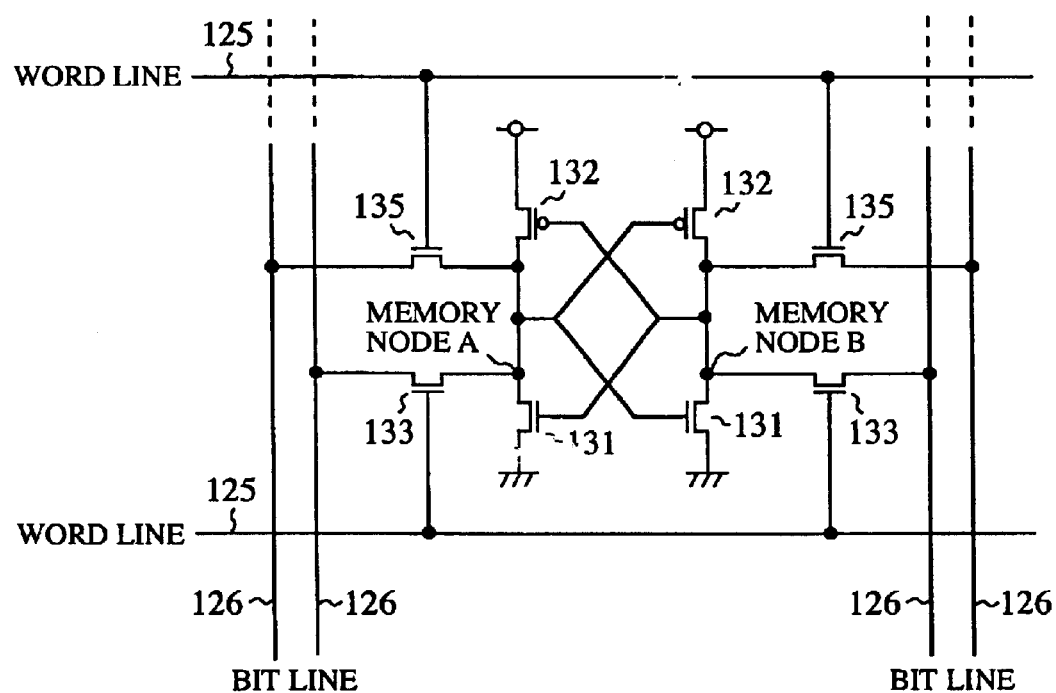
FIG. 15 is a circuit diagram to illustrate an internal construction of the conventional dual port memory cell.

In this manner, the reading operation needs to control the word line 11 and a pair of the bit lines 12, and the writing operation needs to control the load transistor control line 13 and a pair of the memory cell VCC lines 14A and 14B. Since these controls can be done separately, the dual port memory cell that has required 8 transistors conventionally, as shown in FIG. 15, can be accomplished with 6 transistors in the same manner as the Full CMOS type single port memory cell as shown in FIG. 13.

According to the embodiment 1 as mentioned above, the control of the word line 11 and a pair of the bit lines 12 in the reading operation, and the control of the load transistor control line 13 and a pair of the memory cell VCC lines 14A and 14B in the writing operation will realize the dual port memory cell with 6 transistors, whereby the semiconductor memory device according to the embodiment 1 achieves availability of reducing the area of the memory cell array.
Embodiment 2

Figure 5:
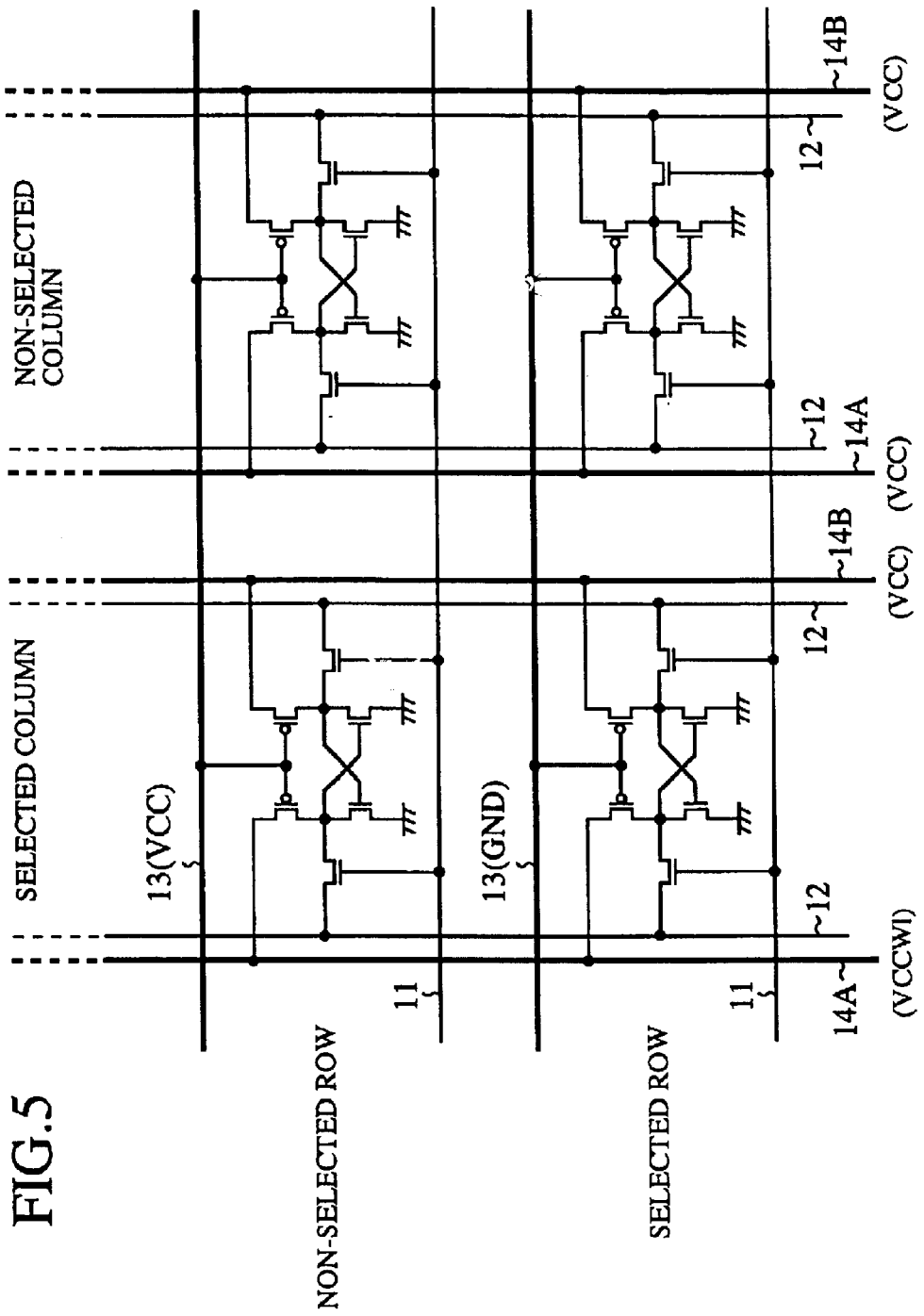
FIG. 5 is a circuit diagram to illustrate a construction of a memory cell array being the semiconductor memory device according to the embodiment 2 of the present invention.

The embodiment 2 is to write the L level data into the memory node A of the memory cell, and the circuit diagram to illustrate the construction of the dual port memory cell is the same as FIG. 1 for the embodiment 1. FIG. 5 is a circuit diagram to illustrate a construction of a memory cell array being the semiconductor memory device according to the embodiment 2, which uses the dual port memory cell illustrated in FIG. 1. The difference from FIG. 1 for the embodiment 1 lies in that the potential of the memory cell VCC line 14A is brought into VCCwl that is lower than VCC being the potential of the memory cell VCC line 14B.

Next, the operation will be explained.

The data holding state and the data reading operation are the same as the embodiment 1.

Next, the writing operation will be explained. As an example, the L level data written into the memory node A will be shown, but the L level data written into the memory node B is the same. The load transistor control line 13 of the concerned memory cell is brought into the GND level, and the word line 11 is brought into the GND level. And, the memory cell VCC line 14A is brought into the VCCwl level that is lower than the VCC level, and the memory cell VCC line 14B is brought into the VCC level.

Since the load transistor control line 13 is in the GND level, the resistances of the load transistors 2 go down, and the data holding state of the memory cell becomes unstable. Now, since the potential of the memory cell VCC line 14A on the side of the L level data being written is the VCCwl that is lower than the VCC being the potential of the memory cell VCC line 14B, the H level data at the memory node A cannot be held, and the L level data is written into the memory node A.

Figure 6:
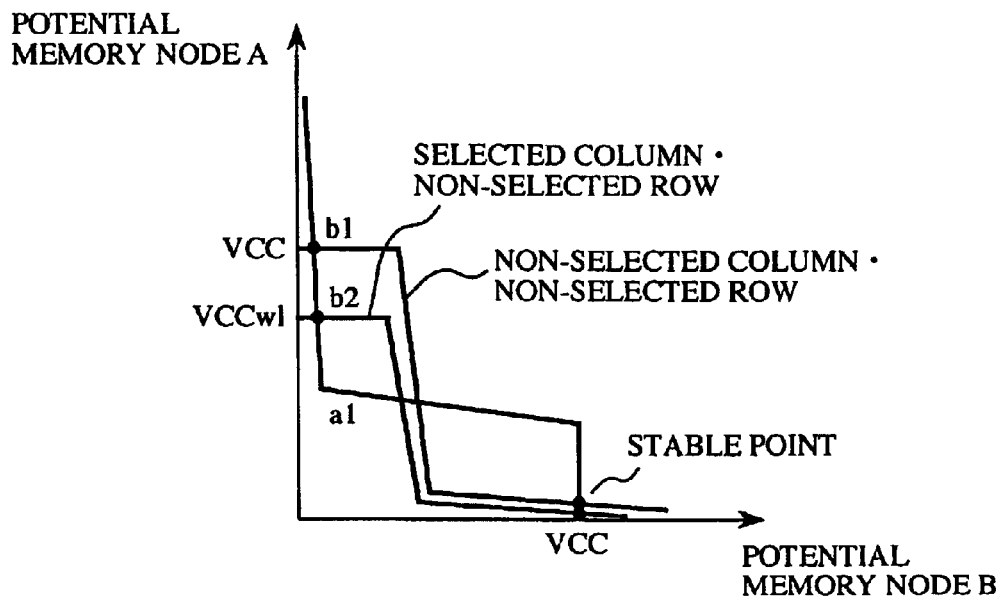
FIG. 6 is a graph to illustrate the data holding state of the memory cell at a non-selected row during the writing operation in the semiconductor memory device of the embodiment 2 of the present invention.

FIG. 6 is a graph to illustrate the data holding state of the memory cell at a non-selected row during the writing operation, and in the drawing the vertical axis, horizontal axis, a1, b1, b2 are the same as FIG. 3 for the embodiment 1 illustrates. Also in FIG. 6, the black dotted intersection of a1 and b1 and the black dotted intersection of a1 and b2 represent stable points. And, the drawing shows that the bigger the diameter of a circle inscribed to a graphic form enclosed by a1 and b1, and the diameter of a circle inscribed to a graphic form enclosed by a1 and b2 become, the more stable the data holding state becomes.

Figure 7:
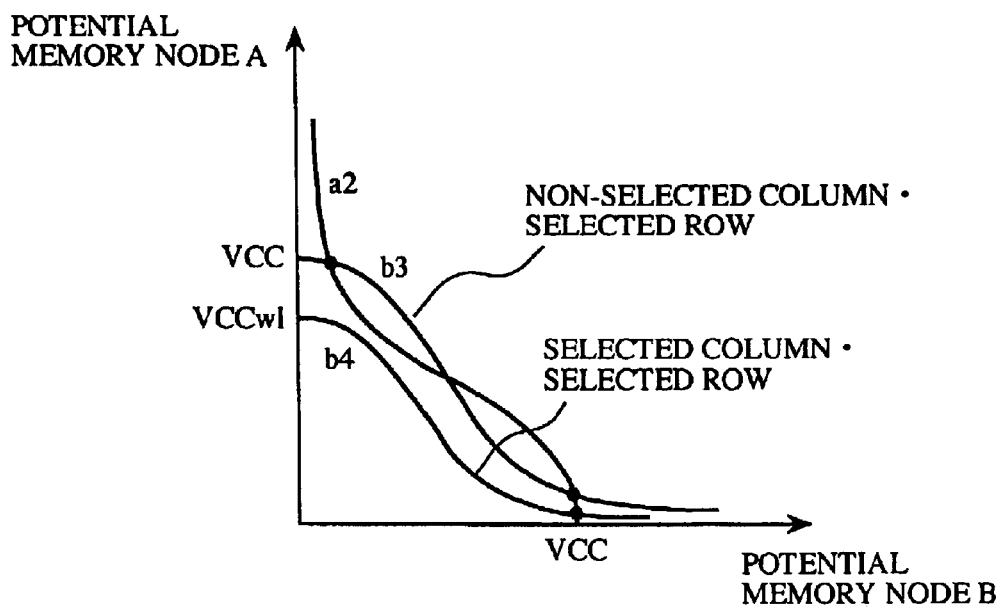
FIG. 7 is a graph to illustrate the data holding state of the memory cell at a selected row during the writing operation in the semiconductor memory device of the embodiment 2 of the present invention.

FIG. 7 is a graph to illustrate the data holding state of the memory cell at a selected row during the writing operation, and in the drawing the vertical axis, horizontal axis, a2, b3, b4 are the same as FIG. 4 for the embodiment 1 illustrates. Also in FIG. 7, the black dotted intersection of a2 and b3 and the black dotted intersection of a2 and b4 represent stable points. And, the drawing shows that the bigger the diameter of a circle inscribed to a graphic form enclosed by a2 and b3, and the diameter of a circle inscribed to a graphic form enclosed by a2 and b4 become, the more stable the data holding state becomes.

In FIG. 6, in the non-selected column and non-selected row, the load transistor control line 13 is in the VCC level, and the memory cell VCC line 14A and 14B are both in the VCC level; accordingly, the memory cell has two stable points as illustrated by a1 and b1, and attains the normal data holding state. And in the selected column and non-selected row, the load transistor control line 13 is in the VCC level, the memory cell VCC line 14A is in the VCCwl level, and the memory cell VCC line 14B is in the VCC level; accordingly, the memory cell has two stable points as illustrated by a1 and b2, and the data holding is possible. Further, in case of FIG. 6, the diameter of a circle inscribed to a graphic form enclosed by a1 and b1 and the diameter of a circle inscribed to a graphic form enclosed by a1 and b2 are significantly big, and the stability of data holing is enhanced.

In FIG. 7, in the non-selected column and selected row, the load transistor control line 13 is in the GND level, and the memory cell VCC line 14A and 14B are both in the VCC level; accordingly, the memory cell has two stable points as illustrated by a2 and b3, and the data holding is possible. On the other hand, in the selected column and selected row, the load transistor control line 13 is in the GND level, the memory cell VCC line 14A is in the VCCwl level, and the memory cell VCC line 14B is in the VCC level; accordingly, the memory cell has one stable point as illustrated by a2 and b4, which leads to impossibility of the H level data holding at the memory node A, and the L level data is written into the memory node A.

In this manner, the reading operation needs to control the word line 11 and a pair of the bit lines 12, and the writing operation needs to control the load transistor control line 13 and a pair of the memory cell VCC lines 14A and 14B. Since these controls can be done separately, the dual port memory cell can be realized with 6 transistors in the same manner as the embodiment 1.

According to the embodiment 2 as mentioned above, the control of the word line 11 and a pair of the bit lines 12 in the reading operation, and the control of the load transistor control line 13 and a pair of the memory cell VCC lines 14A and 14B in the writing operation will realize the dual port memory cell with 6 transistors, and thereby the semiconductor memory device according to the embodiment 2 achieves advantage of reducing the area of the memory cell array.

Embodiment 3

Figure 8:
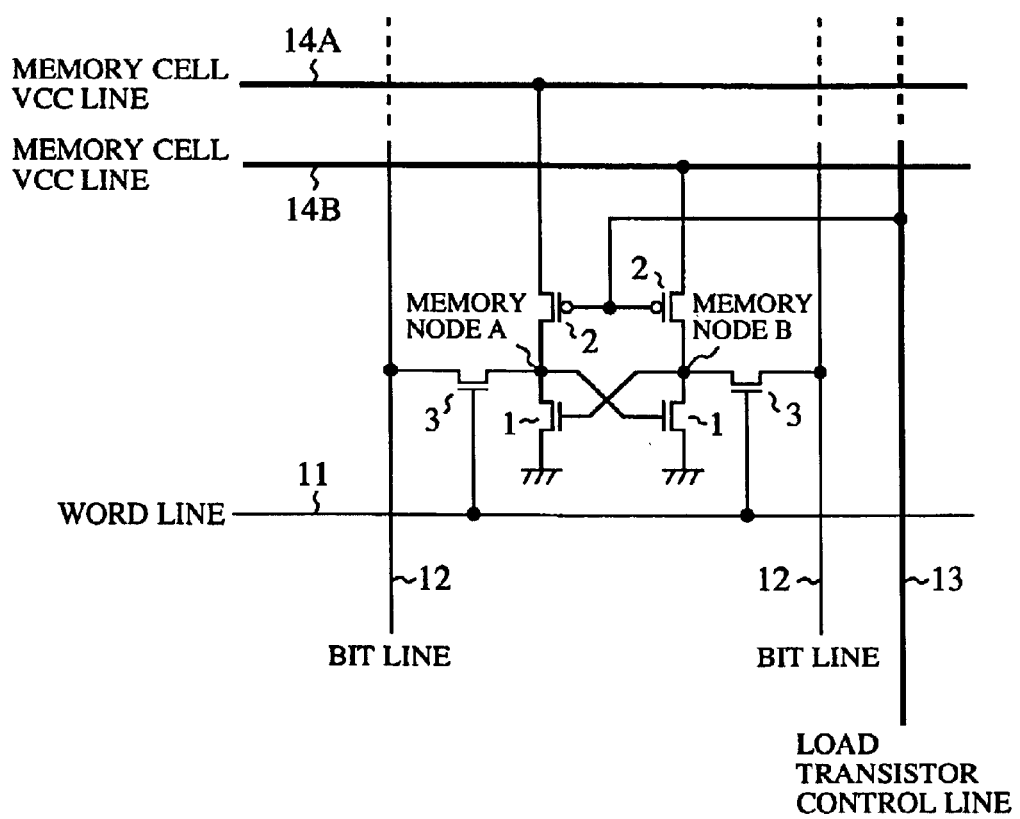
FIG. 8 is a circuit diagram to illustrate a construction of a dual port memory cell in the semiconductor memory device according to the embodiment 3 of the present invention.
Figure 9:
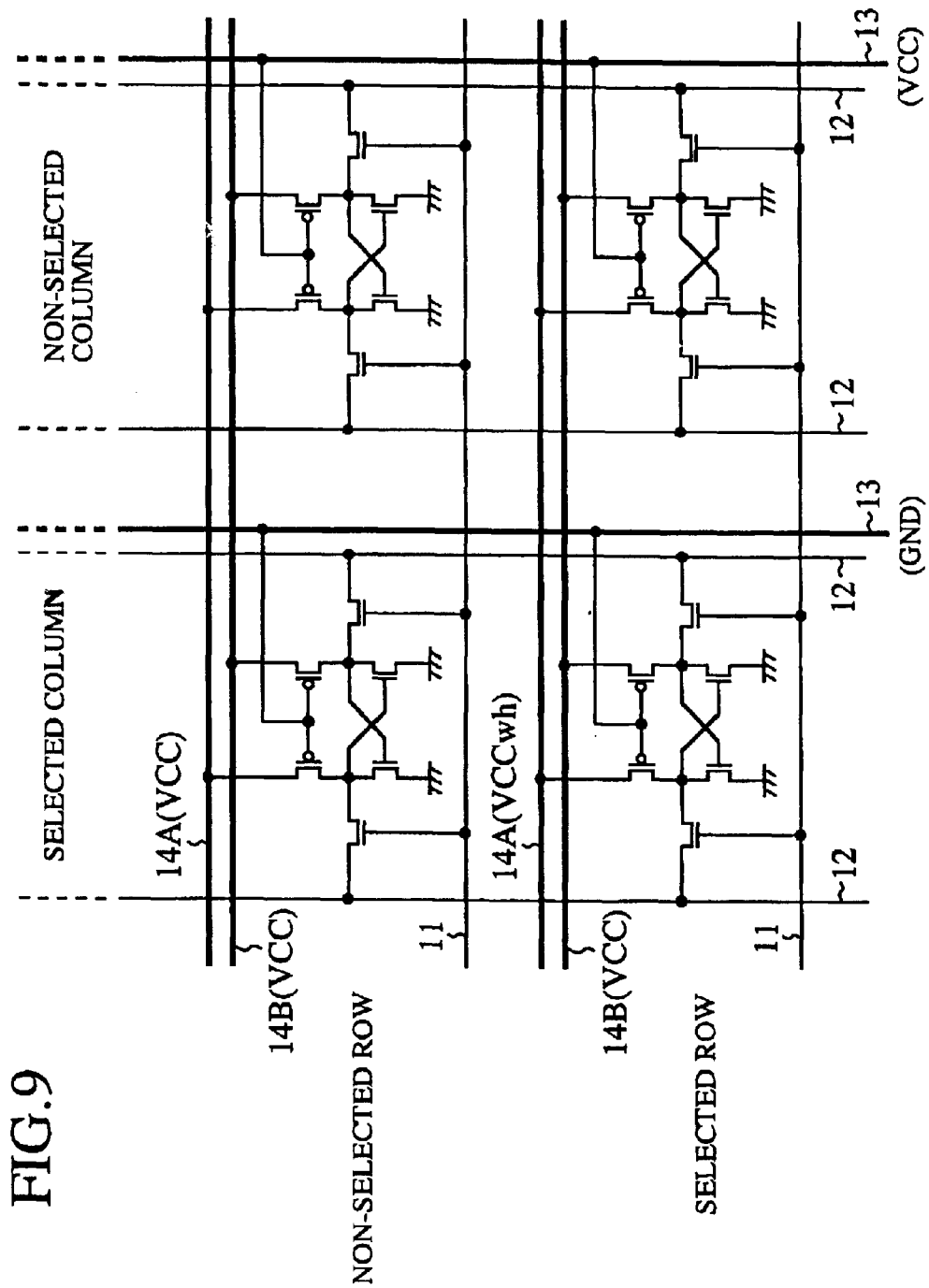
FIG. 9 is a circuit diagram to illustrate a construction of a memory cell array being the semiconductor memory device according to the embodiment 3 of the present invention.

FIG. 8 is a circuit diagram to illustrate a construction of a dual port memory cell in the semiconductor memory device according to the embodiment 3. And, FIG. 9 is a circuit diagram to illustrate a construction of a memory cell array being the semiconductor memory device according to the embodiment 3, which uses the dual port memory cell illustrated in FIG. 8. As shown in FIG. 8 and FIG. 9, the gates of the load transistors 2 are connected to the load transistor control line 13, in common to the memory cells arrayed in the column direction, and the sources of the load transistors 2 are connected to the memory cell VCC lines 14A and 14B, in common to the memory cells arrayed in the row direction. As to the memory cell VCC lines, the memory cell VCC line 14A is connected in correspondence with the memory node A in the memory cell, and the memory cell VCC line 14B is connected in correspondence with the memory node B.

Next, the operation will be explained.

The data hold, read and writing operations are the same as those in the embodiment 1 and embodiment 2.

Thus, according to the embodiment 3, the dual port memory cell can be realized with 6 transistors in the same manner as the embodiment 1 and the embodiment 2, which produces a good result of reducing the area of the memory cell array.

Embodiment 4

Figure 10:
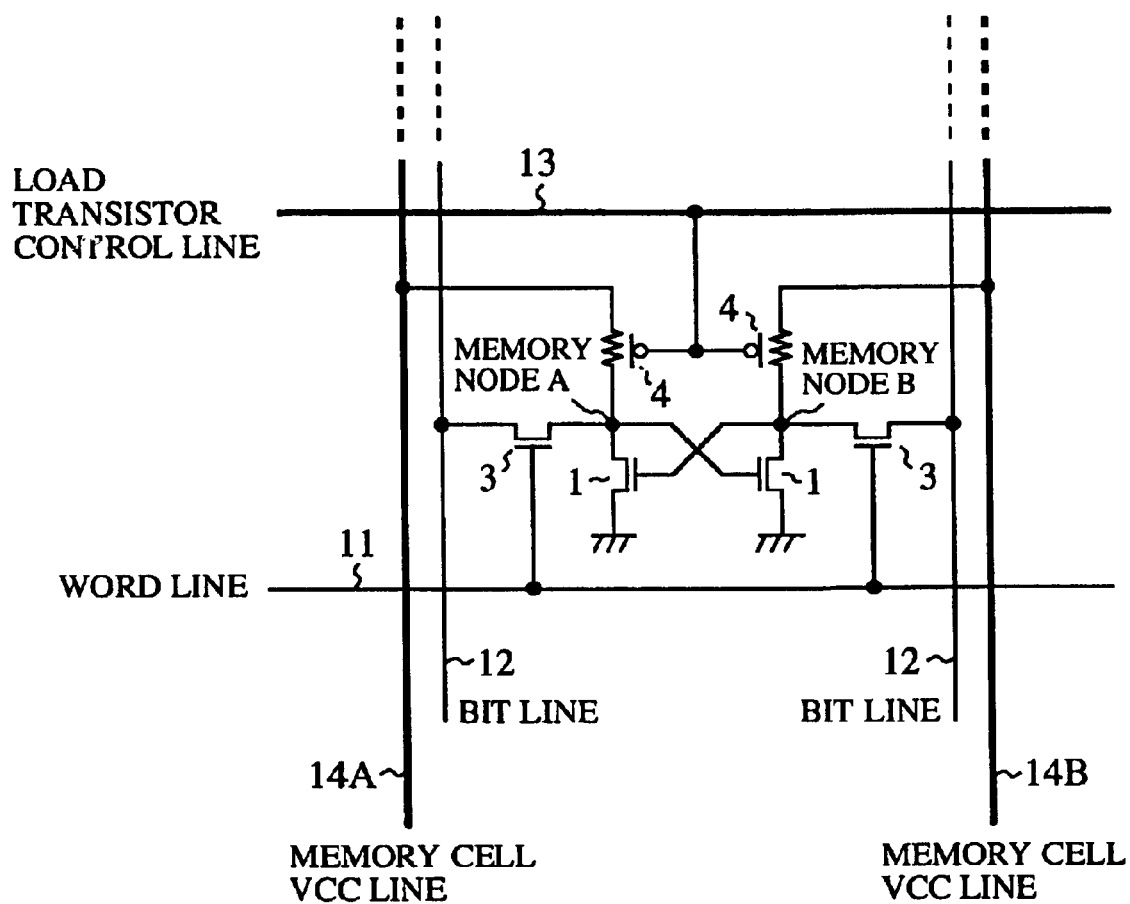
FIG. 10 is a circuit diagram to illustrate a construction of a dual port memory cell in the semiconductor memory device according to the embodiment 4 of the present invention.
Figure 11:
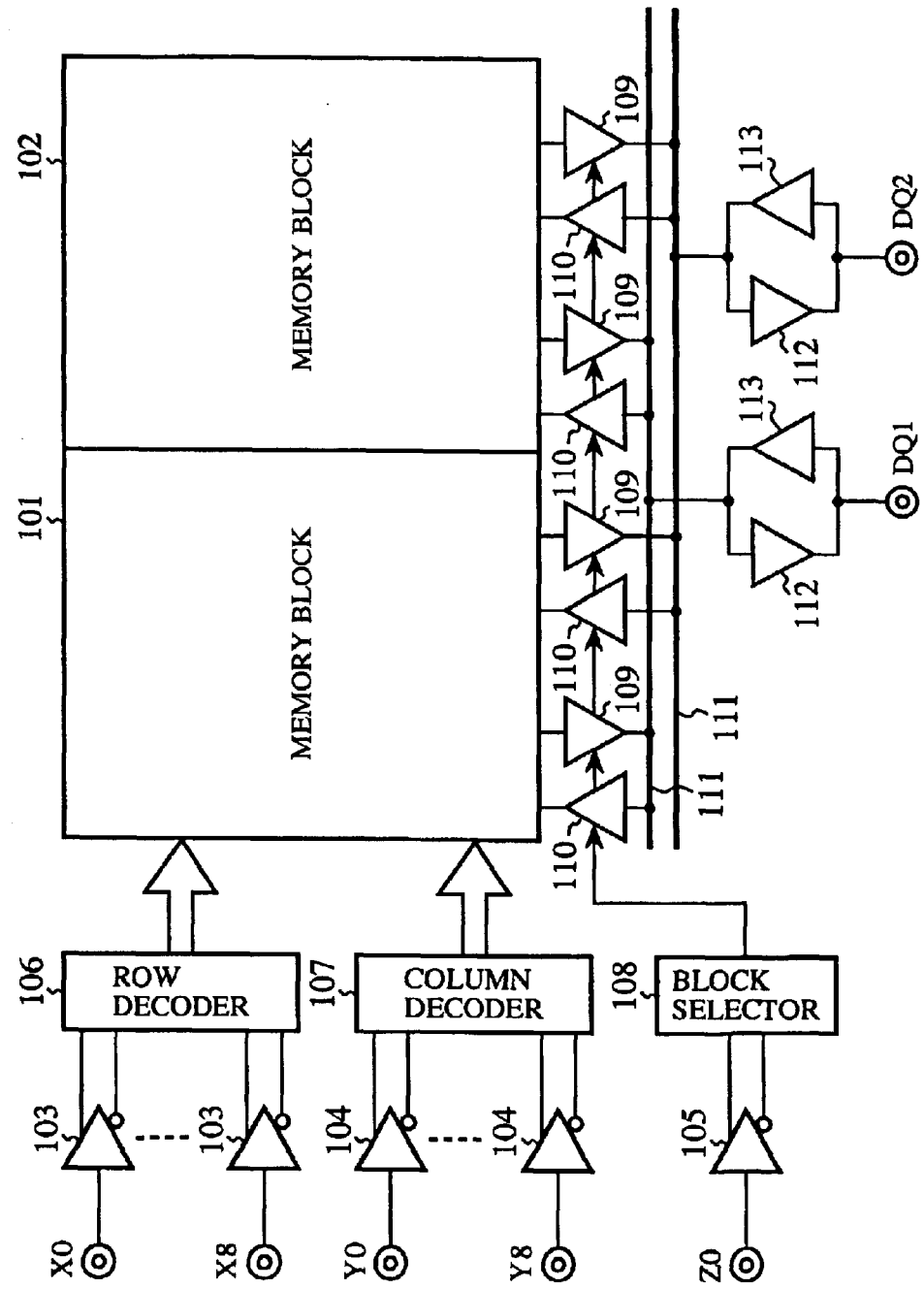
FIG. 11 is a block diagram to illustrate a construction of the conventional SRAM.
Figure 12:
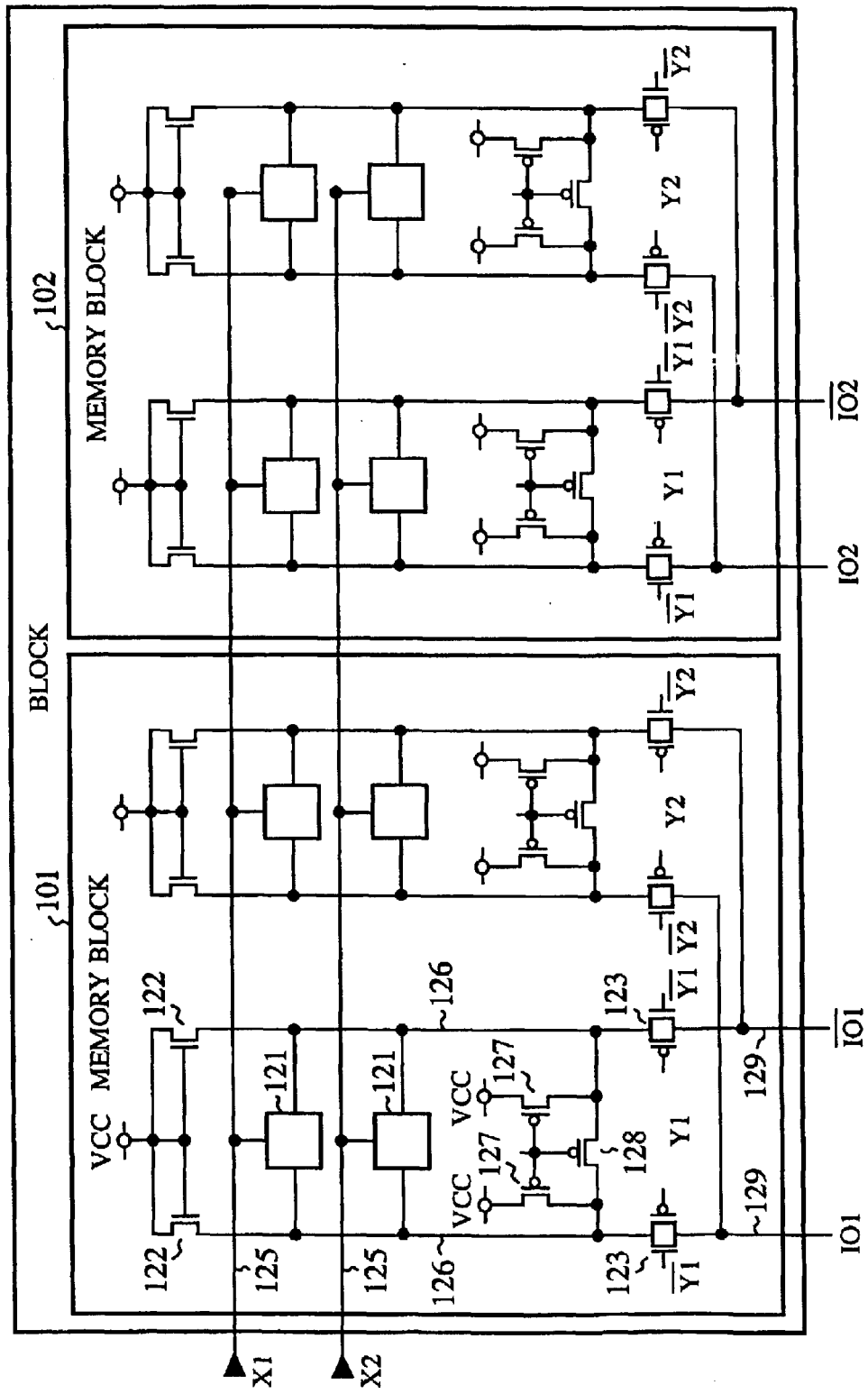
FIG. 12 is a circuit diagram to illustrate an internal construction of the conventional memory block.

FIG. 10 is a circuit diagram to illustrate a construction of a dual port memory cell in the semiconductor memory device according to the embodiment 4. In the drawing, reference numeral 4 denote a load transistor by a TFT (Thin Film Transistor). The construction in FIG. 10 is a replacement of the load transistors 2 composed with bulk PMOS transistors shown in FIG. 1 in the embodiment 1 with the load transistors 4 by the TFT, and the data hold, reading operation, and writing operation are the same as those in the embodiment 1.

By using the TFT, the dual port memory cell can be composed in a lamination construction such that the load transistors 4 by the TFT overlie the driver transistors 1 by the bulk NMOS transistors and the access transistors 3 by the bulk NMOS transistors, which achieves further reduction of the area of the memory cell.

According to the embodiment 4, the area of the memory cell array can further be reduced with the load transistors 4 composed by means of the TFT.

What is claimed is:

1. A semiconductor memory device comprising:

a plurality of memory cells arrayed in the row direction and column direction, capable of a dual port access, wherein:
said memory cell is composed with two driver devices that hold data, two load devices that serve as loads to the driver devices, and two access devices that access said driver devices,
a word line is connected to said access devices in the memory cells arrayed in the row direction,
a pair of bit lines is connected to said access devices in the memory cells arrayed in the column direction,
a load device control line is connected to said load devices in the memory cells arrayed in one of a direction of the row direction and the column direction,
a pair of memory cell VCC lines are connected to said load devices in the memory cells arrayed in the other direction of the row direction and the column direction,
in the data read, said word line makes said access devices conductive to read out data held in said driver devices to said pair of bit lines,
and in the data write, said load device control line brings said load devices into low resistance to write data into said driver devices from said pair of memory cell VCC lines.

2. The semiconductor memory device as claimed in claim 1, wherein said load devices are composed with PMOS transistors, and said driver devices and said access devices are composed with NMOS transistors.

3. The semiconductor memory device as claimed in claim 2, wherein in the data read, said load device control line and said pair of the memory cell VCC lines are brought to a power supply potential, and in the data write, the load device control line is set to a ground potential, one of said memory cell VCC lines is brought to the power supply potential, and the other one thereof is brought to a potential higher than the power supply potential.

4. The semiconductor memory device as claimed in claim 2, wherein in the data read, said load device control line and said pair of the memory cell VCC lines are brought to a power supply potential, and in the data write, said load device control line is set to a ground potential, one of said memory cell VCC lines is brought to the power supply potential, and the other one thereof is brought to a potential lower than the power supply potential.

5. The semiconductor memory device as claimed in claim 1, wherein said load devices in the memory cells are formed of dun film semiconductor devices.

* * * * *